United States Patent [19]

Eloy

[11] Patent Number: 4,714,628
[45] Date of Patent: Dec. 22, 1987

[54] PROCESS AND APPARATUS FOR TREATING A MATERIAL BY A THERMOIONIC EFFECT WITH A VIEW TO MODIFYING ITS PHYSICOCHEMICAL PROPERTIES

[75] Inventor: Jean-Francois Eloy, Saint Ismier, France

[73] Assignee: Commissariat a l'Energie Atomique, Paris, France

[21] Appl. No.: 13,699

[22] Filed: Feb. 12, 1987

[30] Foreign Application Priority Data

Feb. 25, 1986 [FR] France .................. 86 02568

[51] Int. Cl.⁴ ............................. B05D 3/06
[52] U.S. Cl. .................... 427/53.1; 118/620
[58] Field of Search ............ 427/53.1; 250/492.21; 219/121 L, 121 LM; 118/620

[56] References Cited

U.S. PATENT DOCUMENTS

3,551,213 12/1970 Boyle .
4,108,751 8/1978 King .
4,474,827 10/1984 Ferralli .
4,670,064 6/1987 Schachameyer et al. ......... 427/53.1

FOREIGN PATENT DOCUMENTS

2113336 9/1971 Fed. Rep. of Germany ..... 427/53.1
2523982 12/1976 Fed. Rep. of Germany .
1536496 7/1968 France .
57-039169 3/1982 Japan .
2080027 1/1982 United Kingdom .
1118429 10/1984 U.S.S.R. ............... 427/53.1

OTHER PUBLICATIONS

Roshon et al., "IBM TDB", vol. 13, No. 6, 11-1974, pp. 1807-1808.
Coullahan et al., "IBM TDB", vol. 22, No. 6, 11-1979, pp. 2279-2281.
von Gutfeld, "IBM TDB", vol. 7, No. 3, 8-1964, p. 224.
Patent Abstract of Japan, vol. 7, No. 122, 26.5.1983.

Primary Examiner—John H. Newsome
Attorney, Agent, or Firm—Pearne, Gordon, McCoy & Granger

[57] ABSTRACT

Process and apparatus for treating a material by thermoionic effect with a view to modifying its physicochemical properties.

The apparatus comprises a substrate having first and second opposite faces, the first face being covered with a dopant film and being positionable facing the material, while maintaining a space between the film and the material; a source producing a collimated, pulsed laser beam having a given wavelength, directed onto the second face of the substrate which is transparent to said wavelength, said laser beam being able to interact with the dopant film for forming dopant ions by explosive vaporization of the dopant; and electrical means for producing simultaneously with the laser pulse an electric field in said space for accelerating the dopant ions with a view to their thermoionic implantation in the material.

Application to the treatment of metals and alloys.

19 Claims, 4 Drawing Figures

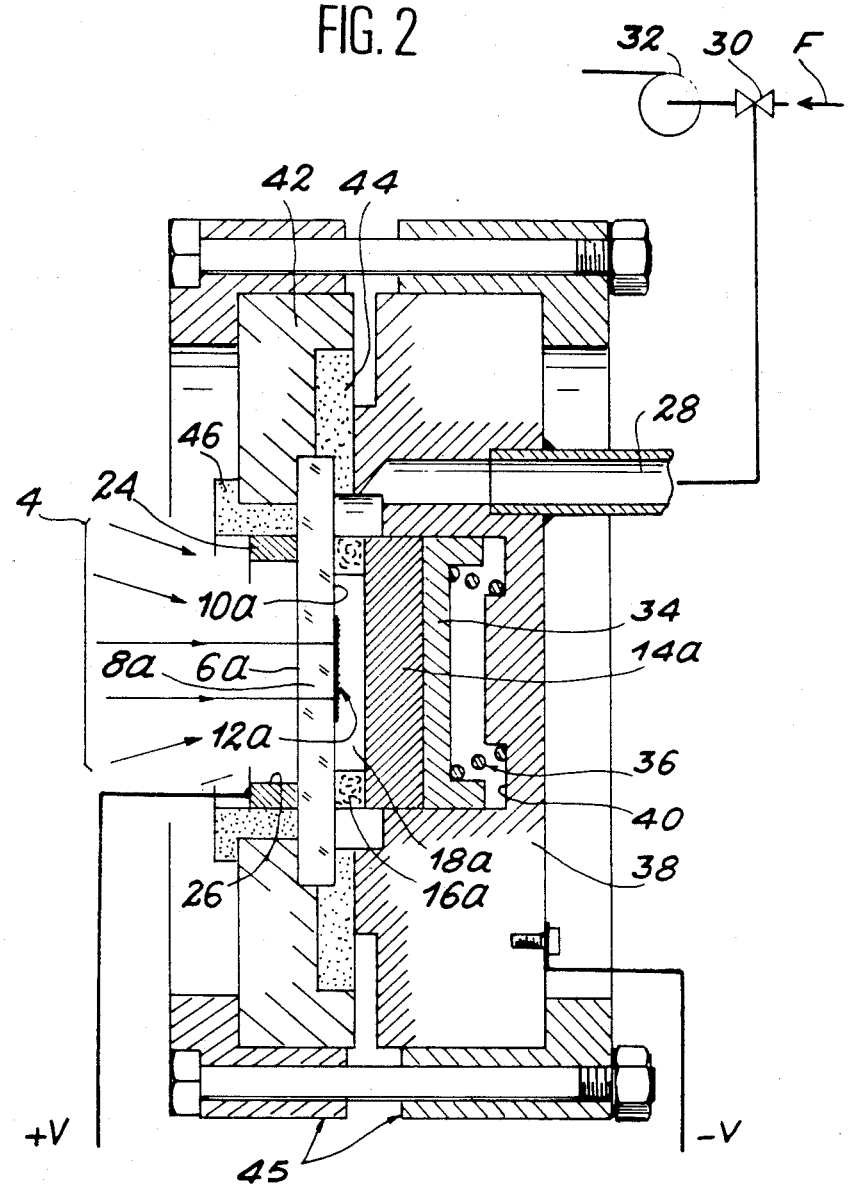

PROCESS AND APPARATUS FOR TREATING A MATERIAL BY A THERMOIONIC EFFECT WITH A VIEW TO MODIFYING ITS PHYSICOCHEMICAL PROPERTIES

BACKGROUND OF THE INVENTION

The present invention relates to a process and to an apparatus making it possible to treat on the surface and in depth a material by a thermoionic effect with a view to modifying its physicochemical properties.

It more particularly applies in the filed of metallurgy to the modification of mechanical properties, both on the surface and in depth, of metals or alloys (reducing the friction coefficient, increasing the resistance to shock, wear, ablation, etc) or for modifying the chemical properties of these materials (corrosion resistance).

However, the invention also applies to the field of microelectronics for modifying the electrical properties of semiconductors and in the field of integrated optics for modifying the refractive indices of certain materials.

The invention also applies both to the treatment of a material partly forming the outer wall of a hollow or solid member and to the treatment of a material partly forming the inner wall of a hollow member.

It is presently known to use the ion implantation of certain chemical species into the surface layer of certain metals in order to modify the mechanical surface properties thereof.

In particular, it is known to produce a surface alloy by implanting ions in a material. This surface production of an alloy is more particularly described in the article in Thin Solid Films, 96, 1982, pp 31–44, Metallurgical and protective coatings by S. WEISSMANTEL et al entitled "Preparation and properties of hard i-C and i-BN coatings". Unfortunately, the implantation of ions in a material considerably increases the thermal stressing of the material, so that its corrosion resistance is reduced.

Moreover, it is known from U.S. Pat. No. 4,398,966, published on Aug. 16, 1983, to increase the corrosion resistance of a steel by subjecting its surface to pulsed laser radiation. Laser impact on the steel surface produces high local heating which stops at the same time as the laser pulse stops. This corresponds to a surface hardening or transient annealing phenomenon used for blocking the structure of the steel obtained at high temperature.

It is also known to use a pulsed laser beam for vaporizing a material, whereby the vaporized material can then be deposited in the form of thin films on a support. This thin film deposition procedure is more particularly described in an article by J. DESSERRE and J. F. ELOY which appeared in B.I.S.T. C.E.A, No. 204, June 1975 and entitled in translation "Interaction of a pulsed coherent light beam with a complex target and application to the production of thin film compounds."

The vaporization of a material with a view to its deposition can in particular be carried out by irradiating a block of said material through a substrate which is optically transparent to the laser radiation used. Such a process is particularly described in No. EP-A-0 002 738.

Moreover, it is known to modify the surface mechanical properties of a material by irradiating it with laser radiation through a substrate, the latter being optically transparent to said radiation. Such a process is described in U.S. Pat. No. 4,401,477, published on Aug. 30, 1983.

In this process, the surface of the material to be treated is covered with a layer absorbing the laser photons with a view to increasing the absorption of the laser radiation by the material to be treated. The laser used is a high power pulsed laser.

The deposition of said absorbing layer of photons requires a particular surface state for the member to be treated, which increases the material treatment time. In addition, this treatment process requires the use of a compression chamber.

SUMMARY OF THE INVENTION

The problem of the present invention is to provide a process for treating a material with a view to modifying its physicochemical properties and in particular improve the mechanical resistance of such materials, making it possible to obviate the various disadvantages referred to hereinbefore. This process is based on an ion implantation procedure, in which the ions are formed by vaporization of the corresponding material subject to pulsed laser radiation, the latter also being used for the hardening of the material to be treated.

More specifically, the present invention relates to a process for treating a material by ion implantation of at least one dopant, wherein it comprises the following stages:

deposition of a dopant film on a surface of a substrate, positioning of the material facing said film-coated surface, whilst leaving a space between the film and the material, irradiation of the film through the substrate by a pulsed, collimated laser beam having a given wavelength in order to form dopant ions by explosive vaporization of the dopant, the substrate being transparent to said wavelength and, simultaneously, producing an electric field in said space for accelerating the dopant ions with a view to their thermoionic implantation in the material.

Compared with the process described U.S. Pat. No. 4,401,477, the process according to the invention makes it possible to eliminate the prior treatment of the material to be treated, which essentially consisted of depositing a laser photon-absorbing layer. Thus, in the process according to the invention, in the space between the dopant film and the material to the be treated, the overall reflectivity of the laser beam and the light emissions (X, UV, etc) resulting from the interaction of the laser beam with the ions produced, is only dependent on the dopant film covering one of the opposite surfaces of the substrate on the one hand and its mechanical behaviour on the other. The nature of the film and its mechanical behaviour determine the time during which said film reflects the laser beam in the direction of the material to be treated up to the complete destruction thereof. This time is short compared with the duration of the laser pulse (approximately 10% of the laser pulse).

Thus, the process according to the invention makes it possible to significantly improve the energy efficiency of the laser - film interaction compared with the prior art. Moreover, this process requires no particular surface state of the surface of the material to be treated.

Through the use of an electric field simultaneously with the irradiation of the dopant film, the process according to the invention permits an ion implantation in the material to treated accompanied by a surface and depth thermal effect in said material. This thermal effect facilitates implantation and consequently makes it possible to obviate the prejudicial effects of the implantation.

This thermal phenomenon results from a very high pressure wave, induced on the one hand by the explosive vaporization of the material and on the other by the discharge produced between the dopant film and the material to be treated. This discharge is due to the electric current induced by the electric field produced between the material and the dopant film, the electrons more particularly coming from the ionization of the dopant.

The pressure wave induced temporarily penetrates the surface layers of the material, thus aiding implantation and also penetrates the deep layers, thus improving the mechanical properties thereof.

In addition, the process according to the invention ensures an extremely fast hardening of the material, bearing in mind the short duration of the process (less than 1 µs).

Preferably, the laser radiation is an electromagnetic radiation with a wavelength of 190 to 1100 nm. Thus, the use of such a radiation makes it possible to increase the thermal effect accompanying ion implantation.

The effectiveness of the inventive process can be advantageously improved by irradiating the dopant film perpendicular to the plane thereof.

It is also advantageous to tightly close the space between the material to be treated and the dopant film. This makes it possible to form a resonant cavity physically constituted by the surface of the material to be treated, which is partly reflecting and by the surface of the dopant film facing the material. This film surface is temporarily reflecting during the time preceding the total destruction of the film (vaporization).

According to a preferred embodiment of the inventive process, the tight space is pressurized and the pressure can range between $10^{-1}$ and $10^7$ Pa. This pressurization is more particularly performed by introducing an optionally ionizable pressurized gas or gas mixture into the space.

The ionization of this additional gas, due to an interaction with the laser beam and/or the electric field, makes it possible to increase the ionization rate of the medium present between the material to be treated and the dopant film and to increase the intensity of the thermal shock or pressure wave. Thus, this makes it possible to considerably increase the effectiveness of the process according to the invention.

The gas can be constituted by an inert gas, such as on of the rear gases (neon, argon, krypton) of nitrogen. The use of inert gas is especially necessary when it is wished to avoid the presence of oxygen in the space between the dopant film and the material to be treated, because said oxygen might react with the material to be treated and damage it.

It is possible to use ionizable active gases, whereby the ions formed therefrom can be implanted in the material to be treated. In particular, the ions from these active gases can be the same as those from the vaporization of the dopant film. For example, the dopant film can be a simple element (boron, phosphorus, silicon, etc) and the additional gas a halide of said element ($BCl_3$, $SiCl_4$, etc).

In general terms, the ions to be implanted for modifying the properties of a random material are positive ions. Consequently, the acceleration of these ions of the dopant film towards the material to be treated is realized by bringing the substrate to a positive potential and the material to earth potential or a negative potential.

When the substrate is conductive, the positive potential is directly applied thereto. However, when the substrate is a dielectric, the positive potential is applied thereto via an electrode attached to the substrate.

Advantageously, the material to be treated is preheated in order to increase the diffusion length of the ions implanted in the material. This preheating is preferably carried out by a lateral part of the laser radiation used for vaporizing the dopant film.

The process according to the invention described hereinbefore is applicable to any type of material, whose physicochemical properties are to be modified, such as e. g. semiconductor materials, metals, alloys of metals or composite materials.

The invention also relates to an apparatus making it possible to perform the treatment process according to the invention. This apparatus comprises a substrate having first and second opposite surfaces, the fist surface being covered with a dopant film and can be positioned facing the material, whilst maintaining a space between the film and the material, a source producing a collimated, pulsed laser beam with a given wavelength, directed onto the second surface of the substrate which is transparent to said wavelength, the laser beam being able to interact with the dopant film for forming dopant ions by explosive vaporization of said dopant and electrical means for producing, simultaneously with the laser pulse, an electric film in said space in order to accelerate the dopant ions with a view to their thermo-ionic implantation in the material.

According to preferred embodiment of the apparatus according to the invention, an optical system is provided for subdividing the laser beam into two parts, a first peripheral part being used for preheating the substrate and a second central part being used for vaporizing the dopant, the dopant film only covering a portion of the first face of the substrate.

In particular, this optical system comprises two annular spherical mirrors, an inner mirror and an outer mirror, which are located coaxially on the beam produced by the source, the concave face of the two mirrors being directed towards the material, the reflecting face of the inner mirror being oriented towards the source and the reflecting face of the outer mirror oriented towards the material.

Unlike in the apparatus described in U.S. Pat. No. 4,401,477, there is not need to use in the present invention a compression chamber, because it is the explosion of the dopant film which locally produces an overpressure and therefore a pressure wave (due to the resonant cavity formed by the substrate and the surface of the material to be treated) or a local thermal shock wave. However, the presence of such a compression chamber still improves the effectiveness of the process.

According to the invention, in order to form a resonant cavity between the dopant film and the material to be treated, the apparatus advantageously has a rigid sealing ring for hermetically sealing said space. This ring is made from an electrically insulating material in order to ensure a good electrical insulation between the material to be treated and the dopant film.

This cavity makes it possible to temporarily store the initial photon energy introduced into the cavity by the optical system for the lateral injection of the peripheral part of the laser beam, as well as to increase said photon energy.

The invention advantageously applies to the treatment of a material at least partly forming the inner wall of a hollow member.

In this case, the apparatus according to the invention comprises a sleeve, whose outer surface is covered with a dopant film, said substrate-forming sleeve being positionable within the member to be treated, a reflector located in the sleeve for reflecting the laser beam onto the inner surface of the sleeve, means for carrying out a relative movement between the reflected laser beam and the inner surface of the sleeve in order to irradiate the entire inner surface.

According to a preferred embodiment, the means for effecting this relative movement comprise a hollow conductive member having in the vicinity of one of its ends a bend located in the sleeve, said end bearing on the inner surface of the sleeve serving as the electrode, the reflector integral with said conductive part being located in the bend, the conductive part being able to rotate about a longitudinal axis and move parallel thereto.

BRIEF DESCRIPTION OF THE DRAWINGS

The invention is described in greater detail hereinafter relative to non-limitative embodiments and the attached drawings, wherein show:

FIG. 2, in longitudinal section, a treatment apparatus according to a first variant of the invention.

DETAILED DESCRIPTION OF THE PREFERRED EMBODIMENTS

Figure 1:
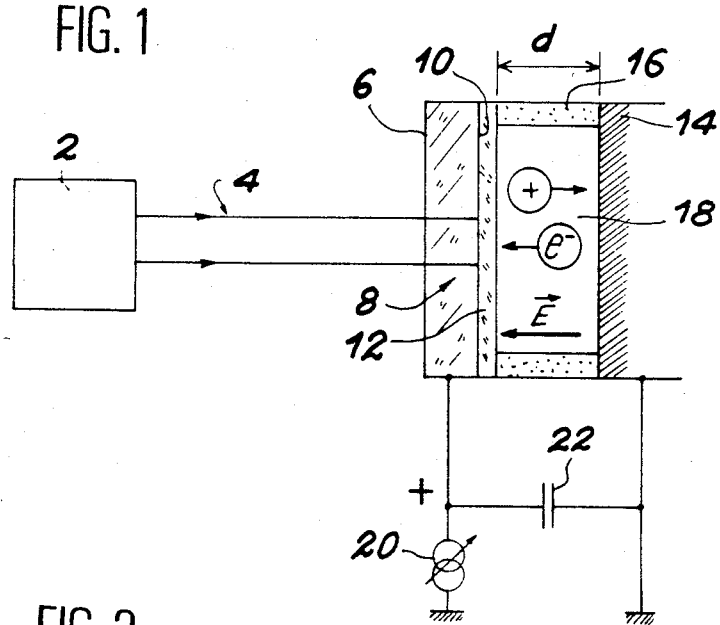
FIG. 1, diagrammatically the treatment process according to the invention.

FIG. 1 shows a laser source 2 emitting a pulsed, collimated laser beam 4 of which several parallel rays are shown. This laser beam is in particular an infrared beam with a wavelength of 1.06 $\mu$m. The duration of the pulse is between $10^{-9}$ and $10^{-6}$ s.

This laser beam 4 is directed onto a first surface 6 of a substrate 8, which is transparent to the wavelength of the laser beam 4 used. For an infrared laser radiation, the substrate can be of glass, Plexiglass, Mylar, zinc oxide or tin and indium oxide (ITO). The second surface 10 of substrate 8, opposite to the first, is covered with a film 12 of a dopant material. Substrate 8 can have a random shape (planar or curved).

Film 12 can be deposited on the substrate by vacuum evaporation. Its thickness is determined as a function of the flux of the laser beam 4, the duration of a laser pulse and the reflecting power of said film 12. Film 12 can be constituted by one or more simple elements, such as boron, aluminum, molybdenum, chromium, etc or a compound of a simple element such as an oxide or a nitride.

Dopant film 12 faces the material 14 to be treated. Material 14 is in particular formed by a metal such as steel 316 or a metal alloy, such as fast steels, aluminium alloys (TiAl, AlLi), uranium alloys or composite materials based on carbon fibers.

An interposed electrically insulating material ring 16 makes it possible to maintain an adequate space d between dopant film 12 and the material 14 to be treated in order to permit the acceleration of particles ionized during laser interaction. Moreover, ring 16, which is e. g. made from glass and asbestos fibers, makes it possible to define with dopant film 12 and the material 14 to be treated, a tight chamber 18 in which a shock wave can exist for the duration of a laser pulse.

Chamber 18, which serves as a resonant cavity, can be pressurized and contain an inert gas, such as a rear gas or nitrogen, or an ionizable active gas able to form ions which can be implanted in the material to be treated.

The substrate, which can be insulating (FIG. 2) or conductive (FIG. 1) is raised to a positive potential supplied by a d.c. voltage source 20. In parallel, material 14 is brought to earth or a negative potential. This potential difference makes it possible to produce an electric field $\vec{E}$ for accelerating the positive dopant ions formed in the tight chamber 18 or cavity.

In order to ensure an energy reserve and the maintenance of the respective polarities of the substrate 8 and the material 14 to be treated, it is possible to provide a low impedance capacitor 22, connected in parallel between substrate 8 and material 14 to be treated. one of the plates of capacitor 22 is connected to voltage source 20 and the other to earth or a negative potential.

The parallel light beam 4 oriented perpendicular to the dopant film 12 makes it possible to explosively vaporize dopant film 12 by interacting therewith via substrate 8. The dopant vapour produced in chamber 18 is ionized as a result of the presence of electric field E and the interaction of the laser beam 4 with the vapour following the disappearance of the film.

The ions formed are then acceleated as a result of the high value electric field $\vec{E}$ (above 1 kV/cm).

In order that the ions formed are sufficiently accelerated to be planted in the material 14 to be treated, the space d separating the dopant film 12 and the material 14 must be sufficiently large and can be between 0.01 and 1 cm.

The thermal or pressure wave induced by the explosive vaporization of the dopant film 12 and the discharge produced in the compression chamber 18 under the effect of the electrons induced by electric field $\vec{E}$ ensure the thermoionic implantation in material 14 of the dopant ions and, if applicable, ions of the gas contained in the chamber.

The relatively short duration of the laser radiation (below $10^{-6}$ s) leads to ultra-fast hardening of the implanted material 14, due to the fact that the latter has a heat sink. Thus, the subsequent cooling wave, when the laser irradiation is suddenly interrupted, rises from the core of material 14 towards its surface.

FIG. 2 shows in section an apparatus permitting the treatment of a planar metal plate 14a, which faces the substrate, which also is shaped like a flat plate transparent to the laser beam 4. Substrate 8a is of an insulating nature and its "inner" face 10a is only partly covered with a dopant film 12a. The other face 6a is equipped with an electrode 24 having an opening 26 in its central part, in order to permit the passage of the laser beam 4 through said electrode. Electrode 24 e.g. has an annular shape.

Space d defined between the inner surface 10a of substrate 8a facing the place 14a to be treated and the actual plate 14a is hermetically sealed by a so-called pressure, electrically insultating annular ring 16a. On the latter is mounted a gas conduit 28 connected, via a two-way valve 30, to a pump 32 permitting the purging of chamber 18a if this proves necessary. In particular, the treatment according to the invention of a metal or an alloy takes place in the absence of oxygen, in order to prevent the oxidation of said metal. Moreover, valve 30 permits the introduction, as shown by the arrow F, of an inert or active gas into chamber 18a.

In the case of implanting boron ions in an aluminium plate 14a, the gas used can be boron chloride which, under the impact of laser beam 4 and the electric field, ionizes and participates in the implantation of boron ions in plate 14a.

In the embodiment shown in FIG. 2, the plate to be treated 14a is applied to the sealing ring 16a by means of a more particularly conductive counterplate 34, which is compressed by a spring 36. This action on chamber 18a justifies its name of compression chamber.

Spring 36 is integral with a metal part 38 having a recess 40 in which is located the plate 14a to be treated and also the counterplate 34. Conductive part 38 to which is applied a negative potential −V or ground or earth potential (FIG. 1) has a part which is in contact with the metal plate 14a to be treated. Insulating substrate 8a is mounted on a support plate 42, which can be kept facing part 38 by a flange system 45. Joints 44, between parts 38 and 42 ensure the sealing of chamber 18a. In addition, there is an electrically insulating annular joint 46 surrounding electrode 24 to which is applied a positive potential +V, which prevents any short-circuit between substrate 8a and the metal plate 14a to be treated.

The aforementioned mechanical stressing system makes it possible to withstand the shock wave, due to the interaction between the laser and the dopant film, as well as the electric field produced in the compression chamber.

Figure 3:
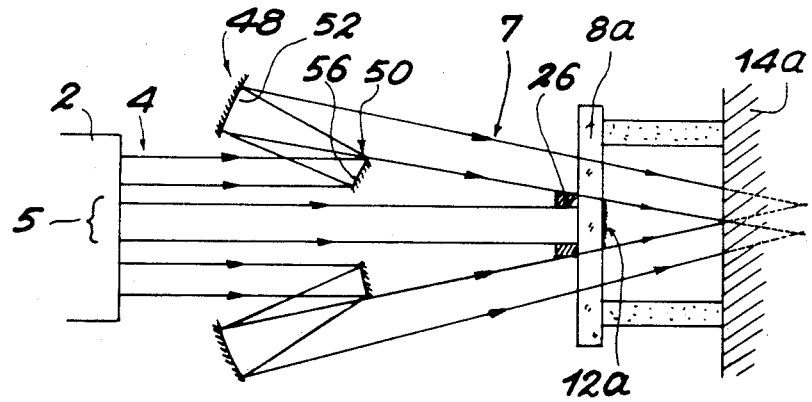
FIG. 3, diagrammatically the optical system for subdividing into two parts the laser beam according to the invention.

In order to increase the diffusion length of the dopant ions and, if applicable, the ions of the gas contained in chamber 18 into the material to be treated, preheating of the latter takes place. As shown in FIG. 3, this preheating can be carried out by subdividing the collimated laser beam 4, produced by source 2, into two parts, namely a central part 5 and a lateral or peripheral part 7. Central part 5 is used for irradiating dopant film 12a, in order to permit its vaporization, whilst the lateral part 7 is used for preheating the plate 14a to be treated.

As annular electrode 26 and dopant film 12a only partly cover the corresponding surfaces of substrate 8a, it is possible for the lateral part 7 of the laser beam, via substrate 8a, to only interact with the material plate 14a to be treated.

The optical system for subdividing laser beam 4 into two parts is of the inverted Cassegrain type. It is in particular described in U.S. Pat. No. 4,330,208, granted on May 18, 1982. This system comprises two annular spherical mirrors 48, 50, which are positioned coaxially on laser beam 4. Mirror 48 is called the outer mirror and is concave, whilst mirror 50 is called the inner mirror and is convex. The reflecting face 56 of inner mirror 50 is oriented towards laser source 2 and the reflecting face 52 of outer mirror 48 is oriented towards the plate 14a to be treated. The annular shape of mirrors 48 and 50 permits the direct transfer, without reflection, of the central part 5 of the laser beam.

The radii of curvature and the focal distance of the mirrors are adapted on the one hand to the size of the laser beam and on the other to the size of the conductive electrode 26, as well as to the dimension of the surface of plate 14a to be treated. These dimensional elements are determined in such a way that the lateral part 7 of the laser beam is focused in the interior of the material to be treated. Typically, the focal distance of the optical system is 400 mm, the radius of curvature of the inner mirror 50 is 900 mm and the radius of curvature of the outer mirror 48 is 600 mm.

The aforementioned optical device makes it possible to preventatively bombard the surface of the material to be treated by taking the frequently less intense peripheral part of the laser beam and focusing it onto the same axis as the more intense, collimated and non-deviated part 5. Central part 5 produces the explosive vaporization of the dopant film with a slight time lag compared with the pre-irradiation by peripheral part 7 of the laser beam. Thus, the material to be treated undergoes surface sensitization and a pre-absorption phase producing a first thermal shock initializing the pressure or shock wave phenomenon.

Figure 4:
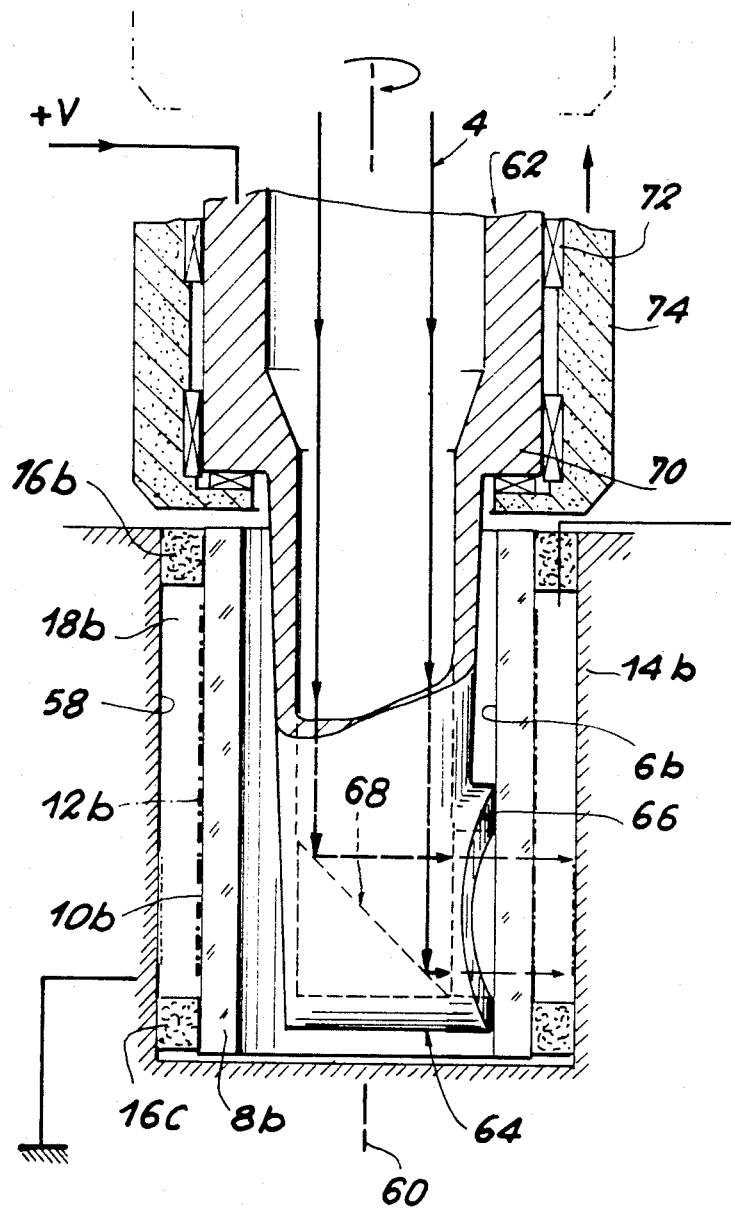
FIG. 4, in longitudinal section, a treatment apparatus according to a second variant of the invention.

FIG. 4 shows an apparatus according to the invention for treating a material for at least partly forming the inner wall of an in particular cylindrical hollow member. The hollow member is 14b and the inner wall to be treated 58, whilst 60 designates the central longitudinal axis of symmetry of the recess of the part to be treated.

Within the part to be treated is placed a cylindrical sleeve 8b which serves as a substrate and which is transparent to the collimated laser beam 4 used. The longitudinal axis of the sleeve coincides with axis 60. The outer surface 10b of said sleeve is covered with a dopant film 12b. Thus, dopant film 12b faces the inner wall 58 of the hollow member to be treated and is at a certain distance from said wall.

This treatment apparatus also comprises a hollow conductive part 62 having a bend or elbow 64 in the vicinity of one of its ends 66. This bend is located in sleeve 8b. End 66 of part 62 bears on the inner surface 6b of sleeve 8b. Said end 66 serves as an electrode for raising the sleeve 8b to positive potential. Conductive part 62 is insulated from the earth or negative potential applied to the part to be treated.

An optical reflector 68 is located in the bend 64 of conductive part 62 and is integral therewith. Reflector 68 can be a mirror arranged obliquely in the bend or a total reflection prism. The reflecting face of the reflector forms an angle of 45° relative to axis 60 and is oriented towards end 66. The laser beam reflected by reflector 68 is consequently transmitted in a radial direction perpendicular to axis 60.

Reflector 68 must be able to completely reflect the wavelength of the laser beam 4 transmitted into part 62, parallel to longitudinal axis 60. Reflector 68 can have a multilayer treatment, in order to withstand the high laser fluxes used for the treatment of the inner surface of part 14b.

In order to completely treat the inner wall 58 of hollow member 14b, conductive part 62 can move longitudinally along axis 60, as shown by the arrows. In the same way, it must be possible for part 62 to rotate about axis 60. For this purpose, part 62 has a widened portion 70 located externally of sleeve 8b resting on bearings or rollers 72 located within a cylindrical insulating part 74, whereof the longitudinal axis coincides with axis 60.

The rotation and/or translation of part 62 is brought about in known manner, more particularly using not shown stepping motors. A not shown reference marking system can optionally be provided for indicating the position of part 62 with respect to the surface 58 to be treated.

In order that the annular space defined between sleeve 8b and inner wall 58 of the part to be treated constitutes a tight compression chamber 18b, two annular rings 16b and 16c, which are of an electrically insulating nature can be mounted on the two ends of sleeve 8b as hereinbefore, chamber 18b can be pressurized and/or filled with an inert or active gas.

The irradiation of the complete dopant film 12b, via sleeve 8b, is performed by successive laser shots without disassembly and without replacing the components of the apparatus.

The processes and apparatuses of the invention have made it possible to treat a steel member with a view to decreasing its friction coefficient, which was brought about by the surface implantation of aluminium or molybdenum in the steel. For this purpose, use was made of a laser source emitting a beam of wavelength 1.06 $\mu$m, a power of 200 MW/cm$^2$ and whose pulse duration was $3.10^{-8}$s. The substrate used was of aluminium. The space d separating the dopant layer and the surface of the material to be treated was 0.05 cm. Furthermore, the thickness of the dopant film was 0.8 $\mu$m and the electric field $2.10^4$ V/cm. The compression chamber was filled with $N_2$ under a pressure of 1 bar.

Under the same conditions, chromium was thermoionically implanted in a TiAl alloy in order to increase the ablation resistance of said alloy.

What is claimed is:

1. A process for treating a material with a view to modifying its physicochemical properties by ion implantation of at least one dopant, wherein it comprises the following stages:
   deposition of a dopant film on a surface of a substrate, positioning of the material facing said film-coated surface, whilst leaving a space between the film and the material, irradiation of the film through the substrate by a pulsed, collimated laser beam having a given wavelength in order to form dopant ions by explosive vaporization of the dopant, the substrate being transparent to said wavelength and, simultaneously producing an electric field in said space for accelerating the dopant ions with a view to their thermoionic implantation in the material.

2. A treatment process according to claim 1, wherein the laser beam is an infrared, visible or ultraviolet radiation.

3. A treatment process according to claim 1, wherein the film is irradiated perpendicular to its plane.

4. A treatment process according to claim 1, wherein the space is tightly sealed in order to form a resonant cavity.

5. A treatment process according to claim 1, wherein the space is filled with a gas able to form ions which can be implanted in the material.

6. A treatment process according to claim 1, wherein the space is filled with an inert gas.

7. A treatment process according to claim 1, wherein the space is placed under pressure.

8. A treatment process according to claim 1, wherein the electric field is produced by raising the substrate to a positive potential and the material to earth or negative potential.

9. A treatment process according to claim 1, wherein the material is preheated in order to aid ion implantation.

10. A treatment process according to claim 9, wherein preheating is carried out by a lateral part of the laser beam.

11. An apparatus for treating a material with a view to modifying its physicochemical properties by the ion implantation of at least one dopant, wherein it comprises:
   a substrate having first and second opposite surfaces, the first surface being covered with a dopant film and can be positioned facing the material, whilst maintaining a space between the film and the material,
   a source producing a collimated, pulsed laser beam with a given wavelength, directed onto the second surface of the substrate which is transparent to said wavelength, the laser beam being able to interact with the dopant film for forming dopant ions by explosive vaporization of said dopant and
   electrical means for producing, simultaneously with the laser pulse, an electric field in said space in order to accelerate the dopant ions with a view to their thermoionic implantation in the material.

12. An apparatus according to claim 11, wherein it comprises at least one rigid sealing ring for hermetically sealing the space, the ring being made from an electrically insulating material.

13. An apparatus according to claim 11, wherein it comprises means for supplying gas under pressure into said space.

14. An apparatus according to claim 11, wherein the electrical means comprise a capacitor connected between the substrate and the material, the substrate being raised to a positive potential and the material to earth or a negative potential.

15. An apparatus according to claim 11, wherein with the substrate being a dielectric, an electrode is provided on the second surface of the substrate, said electrode being provided with an opening in order to permit the passage of the laser beam through said electrode.

16. An apparatus according to claim 11, wherein an optical system is provided for subdivding the laser beam into two parts, a first peripheral part being used for preheating the substrate and a second central part for vaporizing the dopant, the dopant film only covering a portion of the first surface of the substrate.

17. An apparatus according to claim 16, wherein the optical system comprises two annular spherical mirrors, an inner mirror and an outer mirror arranged coaxially on the laser beam produced by the source, the concave face of the two mirrors being directed towards the material, the reflecting face of the inner mirror being oriented towards the source and the reflecting face of the outer mirror towards the material.

18. An apparatus according to claim 11, for treating a material forming at least partly the inner wall of a hollow member, wherein it comprises a sleeve, whose outer surface is covered with the dopant film, said sleeve forming the substrate being positionable within the part to be treated, a reflector located in the sleeve for reflecting the laser beam on the inner surface of the sleeve, means for effecting a relative movement between the reflected laser beam and the inner surface of the sleeve in order to irradiate all the inner surface.

19. An apparatus according to claim 18, wherein the means for effecting a relative movement comprise a hollow conductive part having in the vicinity of one its ends a bend located in the sleeve, said end bearing on the inner surface of the sleeve serving as an electrode, the reflector integral with said conductive part being located in the bend, whereby the conductive part is able to rotate about a longitudinal axis and move parallel thereto.

* * * * *